(12) United States Patent
Kim

(10) Patent No.: US 6,771,558 B2
(45) Date of Patent: Aug. 3, 2004

(54) SEMICONDUCTOR MEMORY DEVICE

(75) Inventor: Tae Yun Kim, Chungcheongbuk-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/256,857

(22) Filed: Sep. 27, 2002

(65) Prior Publication Data

US 2003/0117882 A1 Jun. 26, 2003

(30) Foreign Application Priority Data

Dec. 21, 2001 (KR) ........................................ 2001-82257

(51) Int. Cl.⁷ ................................................ G11C 8/00
(52) U.S. Cl. ...................... 365/233; 365/201; 365/203
(58) Field of Search ................................. 365/233, 201, 365/203, 189.07, 194

(56) References Cited

U.S. PATENT DOCUMENTS

| | | | |
|---|---|---|---|
| 5,590,082 A | 12/1996 | Abe | 365/222 |
| 5,748,560 A | 5/1998 | Sawada | 365/233 |
| 5,805,928 A | 9/1998 | Lee | 710/35 |
| 5,896,404 A | 4/1999 | Kellogg et al. | 714/763 |
| 5,910,923 A | 6/1999 | Brown et al. | 365/201 |
| 6,067,273 A | 5/2000 | Morgan | 365/236 |
| 6,069,829 A | 5/2000 | Komai et al. | 365/201 |
| 6,088,291 A | 7/2000 | Fujioka et al. | 365/233 |
| 6,108,248 A * | 8/2000 | Oh | 365/193 |
| 6,111,807 A * | 8/2000 | Ooishi | 365/230.01 |
| 6,229,759 B1 | 5/2001 | Morgan | 365/236 |
| 6,246,619 B1 | 6/2001 | Ematrudo et al. | 365/201 |
| 6,246,620 B1 | 6/2001 | Fujioka et al. | 365/205 |

FOREIGN PATENT DOCUMENTS

| | | |
|---|---|---|
| JP | 59-063082 | 4/1984 |
| JP | 1-261925 | 10/1989 |
| JP | 5-101699 | 4/1993 |
| JP | 10-289600 | 10/1998 |

OTHER PUBLICATIONS

German Patent and Trademark Office Search Report dated May 2, 2003.

* cited by examiner

*Primary Examiner*—Tan T. Nguyen
(74) *Attorney, Agent, or Firm*—Marshall, Gerstein & Borun LLP

(57) ABSTRACT

A semiconductor memory device that generates, during a test operation, a burst control signal having a short pulse in a disable time of a burst control signal by using a pulse generator to control a precharge time. Accordingly, the semiconductor memory device, when receiving a high frequency operation clock signal, can be tested without delay of a test time by using a test circuit operated synchronously with a low frequency operation clock signal.

21 Claims, 9 Drawing Sheets

SEMICONDUCTOR MEMORY DEVICE

BACKGROUND OF THE INVENTION

1. Field of the Invention

The present invention relates to a semiconductor memory device and, in particular, to a semiconductor memory device which can perform a test operation at a high frequency without delay of a test time, by generating a burst control signal for maintaining an active state of a column operation as long as a burst length as a short pulse signal in the test operation.

2. Description of the Background Art

FIG. 1 is a block diagram illustrating a conventional semiconductor memory device.

The conventional semiconductor memory device includes a state control unit 1, a clock buffer 2, a burst length control unit 3, a burst end control unit 4 and a precharge control unit 5. In particular, the state control unit 1 receives external control signals /CS, /RAS, /CAS and /WE, and generates operation commands RACT<0:N>, CACT<0:N> and WTA. The clock buffer 2 receives an external clock signal EXCLK and generates a pulse clock signal CLKP having a short pulse in correspondence with a rising edge of the external clock signal EXCLK and an inverted clock signal CLKB having the opposite phase to the external clock signal EXCLK. Burst length control unit 3 outputs a burst control signal /YBST for maintaining an active state of a column operation as long as a burst length BL according to the column active commands CACT<0:N>. The burst end control unit 4 detects an end point of the burst length BL and outputs a burst end signal YBSTEND notifying burst end by using the burst control signal /YBST. Finally, the precharge control unit 5 generates a precharge signal IPCG for performing a precharge operation of the semiconductor memory device according to the write command WTA with an autoprecharge command.

FIG. 2 is a detailed circuit diagram illustrating the burst end control unit 4 of the semiconductor memory device of FIG. 1. As shown, the burst end control unit 4 includes a comparing unit 6 that is enabled according to the pulse clock signal CLKP or the inverted clock signal CLKB from the clock buffer 2 selectively transmitted according to a test mode signal TM in order to drive the burst control signal/YBST. The burst end control unit 4 also includes a burst end signal generating unit 7 reset by a power up signal/PWR and configured for generating the burst end signal YBSTEND by using the output signal from the comparing unit 6.

Within the comparing unit 6 are a PMOS transistor PM1 and an NMOS transistor NM1 having their gates commonly connected to receive the inverted signal/YBST of the burst control signal YBST from the control unit 3 and also having their drains commonly connected. A source of the PMOS transistor PM1 is connected to receive a power voltage VCC. The comparing unit 6 further includes transmission gates TG1 and TG2 for selectively transmitting the pulse clock signal CLKP or inverted clock signal CLKB from the clock buffer 2 according to the test mode signal TM and an inverted signal of the test mode signal TM by an inverter INV1. An NMOS transistor NM2 has its gate connected to receive the clock signal CLKP or CLKB selectively transmitted by the transmission gates TG1 or TG2. The drain of NMOS transistor NM2 is connected to the source of the NMOS transistor NM1 and its source is connected to a ground voltage VSS.

The burst end signal generating unit 7 includes a latch unit 8 having two inverters INV2 and INV3 for latching an output signal COM from the commonly-connected drains of the PMOS transistor PM1 and the NMOS transistor NM1 of the comparing unit 6. Also included is a delay unit 9 having an even number of inverters INV4–INV7 for delaying the output signal from the latch unit 8 for a predetermined time. A NOR gate NOR1 is configured for NORing the output signal from the delay unit 9 and the output signal COM from the comparing unit 6. An inverter INV8 inverts the output signal from the NOR gate NOR1 and outputs the burst end signal YBSTEND. An NMOS transistor NM3 resets the output signal COM from the comparing unit 6 to a low level according to the power up signal/PWR.

The operation of the conventional semiconductor memory device will now be explained.

As shown in FIG. 3, in a normal mode, the test mode signal TM has a low level, the row active command RACT<0> is inputted to maintain a row active state, and the write command WTA with the autoprecharge command is inputted to perform a write operation. When the burst length BL ends, the burst control signal/YBST is disabled from a low to high level, thereby finishing the write operation. In turn, when the burst control signal/YBST is disabled, the burst end signal YBSTEND is generated as a short pulse in correspondence with the rising edge of the pulse clock signal CLKP.

The burst end signal YBSTEND is next transmitted to the precharge control unit 5 to output the precharge signal IPCG having a short pulse. Accordingly, the semiconductor memory device performs the precharge operation according to the precharge signal IPCG As depicted in FIG. 4, in a test mode, the test mode signal TM has a high level, the row active command RACT<0> is inputted to maintain the row active state, and the write command WTA with the autoprecharge command is inputted to perform the write operation. When the burst length BL ends, the burst control signal/YBST is disabled from a low to high level, thereby finishing the write operation. Next, when the burst control signal/YBST is disabled, the burst end signal YBSTEND is generated as a short pulse in correspondence with the rising edge of the inverted clock signal CLKB.

The burst end signal YBSTEND is next transmitted to the precharge control unit 5 to output the precharge signal IPCG having a short pulse. Therefore, the semiconductor memory device performs the precharge operation according to the precharge signal IPCG.

Since the write operation is performed in correspondence with the falling edge of the inverted clock signal CLKB and the precharge operation is performed in correspondence with the rising edge thereof (i.e., the write operation is performed in correspondence with the rising edge of the external clock signal EXCLK and the autoprecharge operation is performed in correspondence with the falling edge thereof) a clock frequency of a test circuit is increased by two times to perform the test. In addition, the write operation and the precharge operation are carried out in every one clock to reduce a test time.

A parameter indicating a time from an input of data to input of the precharge command (data into precharge command; tDPL) is screened according to the test operation. Here, the burst length BL is set up to be one (1), and the write command WTA with the autoprecharge command is transmitted to the respective unit memory cells in every two clocks. However, the test circuit using the above-described methods requires an operation frequency as high as an operation frequency of the semiconductor memory device, and also requires two clocks to perform the write and precharge operations in every unit memory cell. Hence, in order to precisely screen the parameter tDPL, whenever the operation frequency of the semiconductor memory device is increased, a test circuit must be replaced by a test circuit using the corresponding frequency.

Additionally, since a pulse width of the burst control signal/YBST is determined, when the external clock signal EXCLK having a high frequency is inputted as shown in FIG. 5, the burst control signal/YBST is disabled from a low to high level, and the pulse of the burst end signal YBSTEND is generated in correspondence with the rising edge of the inverted clock signal CLKB. The precharge operation is performed by generating the pulse of the burst end signal YBSTEND, not in correspondence with the desired falling edge of the external clock signal EXCLK, but in correspondence with the succeeding falling edge thereof. As a result, the precharge operation is carried out in a time later than the wanted time by one clock. The conventional semiconductor memory device has disadvantages in that the parameter tDPL is not precisely screened and the test time is increased.

SUMMARY OF THE INVENTION

Presently, an apparatus is disclosed that reduces a test time and precisely tests a semiconductor memory device receiving a high frequency operation clock signal by using a test circuit operated synchronously with a low frequency operation clock signal, by generating a column burst signal which is a short pulse signal in correspondence with a rising edge of a column burst signal by using a pulse generator during a test operation.

According to the teachings of the present disclosure, a semiconductor memory device is disclosed having a state control unit that is configured to receive external control signals and output internal commands. A burst length control unit is provided and configured to receive the internal commands from the state control unit and output a burst control signal for maintaining an active state of a column operation for as long as a burst length according to the received internal commands. A clock buffer is further included and configured to receive an external clock signal and generate a pulse clock signal for generating a pulse in accordance with a rising edge of the external clock signal and an inverted clock signal having a phase opposite to a phase of the external clock signal. A burst control signal generating unit is configured to receive the burst control signal from the burst length control unit and, in turn, generate an inverted burst control signal having a phase opposite to a phase of the burst control signal and a test mode burst control signal having a short pulse occurring within a disabled time of the burst control signal. Also included is a burst end control unit that is controlled according to a test mode signal indicating the test mode. The burst end control unit is configured to generate a burst end signal indicating a burst end time by being synchronized with the inverted clock signal and using the inverted burst control signal during a normal operation and by being synchronized with the pulse clock signal and using the test mode burst control signal during a test operation. Finally a precharge control unit is included and configured to perform a precharge operation according to the burst end signal.

DETAILED DESCRIPTION OF THE PREFERRED EMBODIMENTS

A semiconductor memory device constructed in accordance with the teachings of the present disclosure will now be described in detail with reference to the accompanying drawings.

Figure 1:
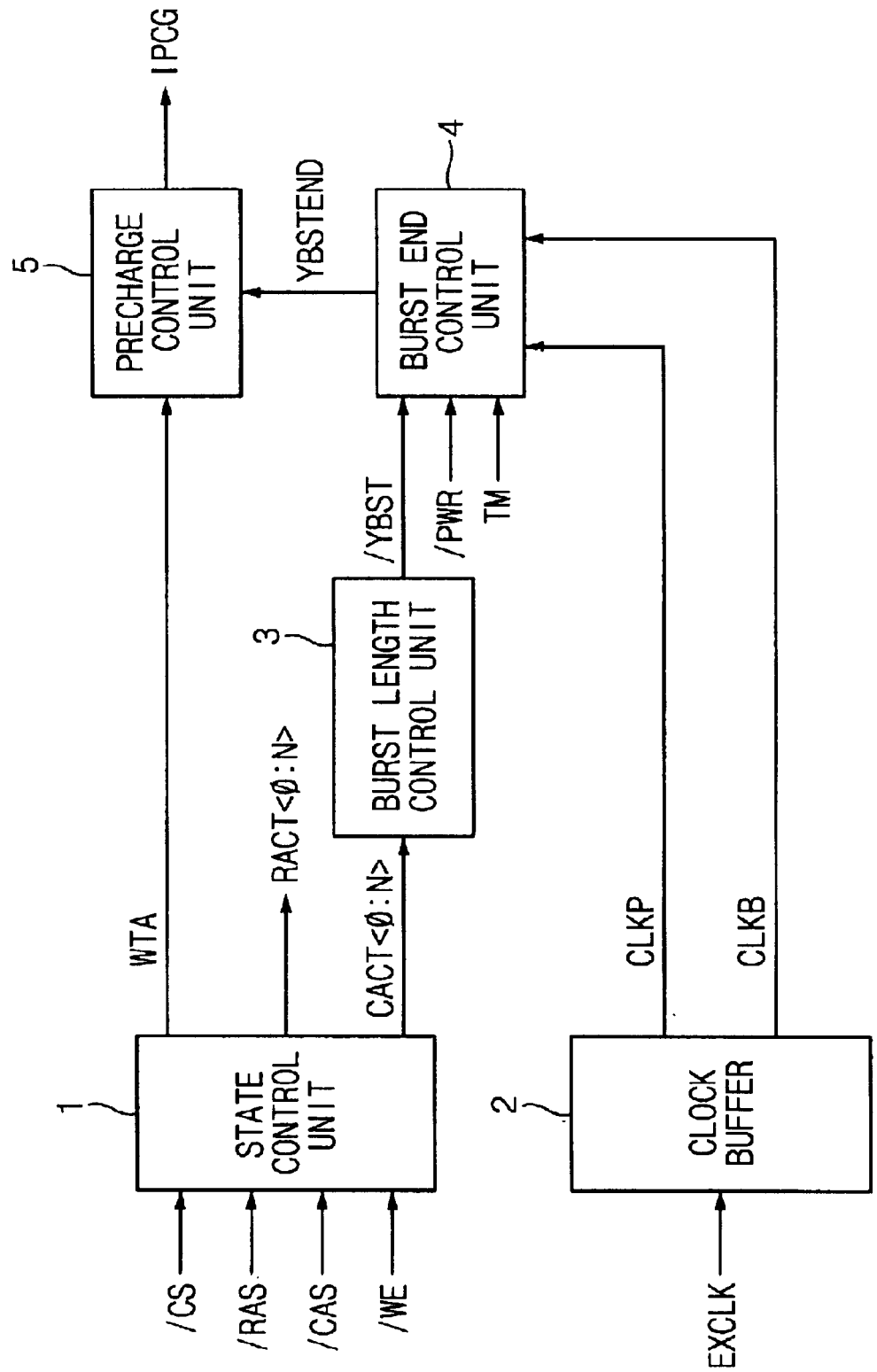
FIG. 1 illustrates a block diagram of a conventional semiconductor memory device.
Figure 2:
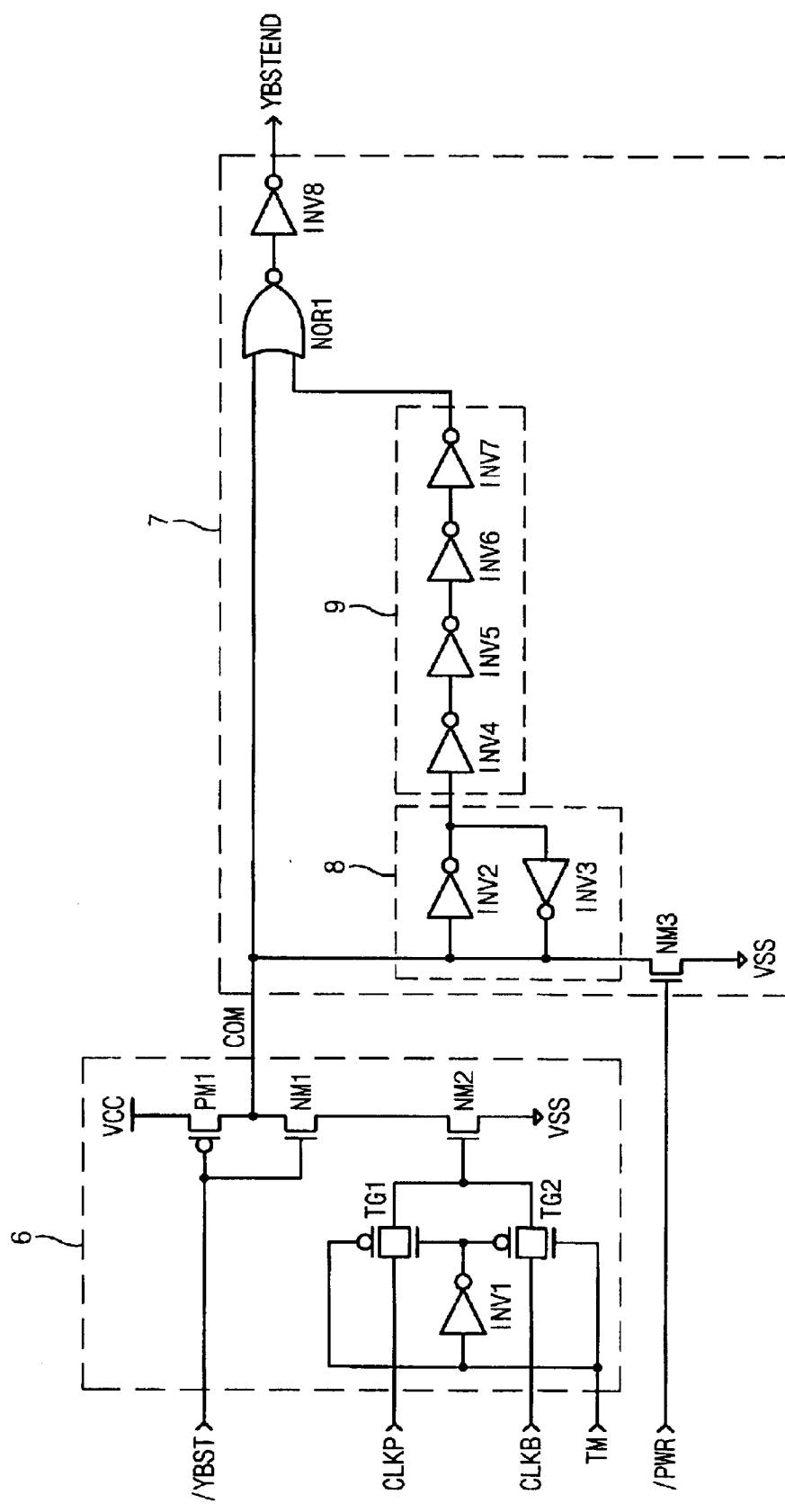
FIG. 2 is a detailed circuit diagram illustrating a burst end control unit in FIG. 1.
Figure 3:
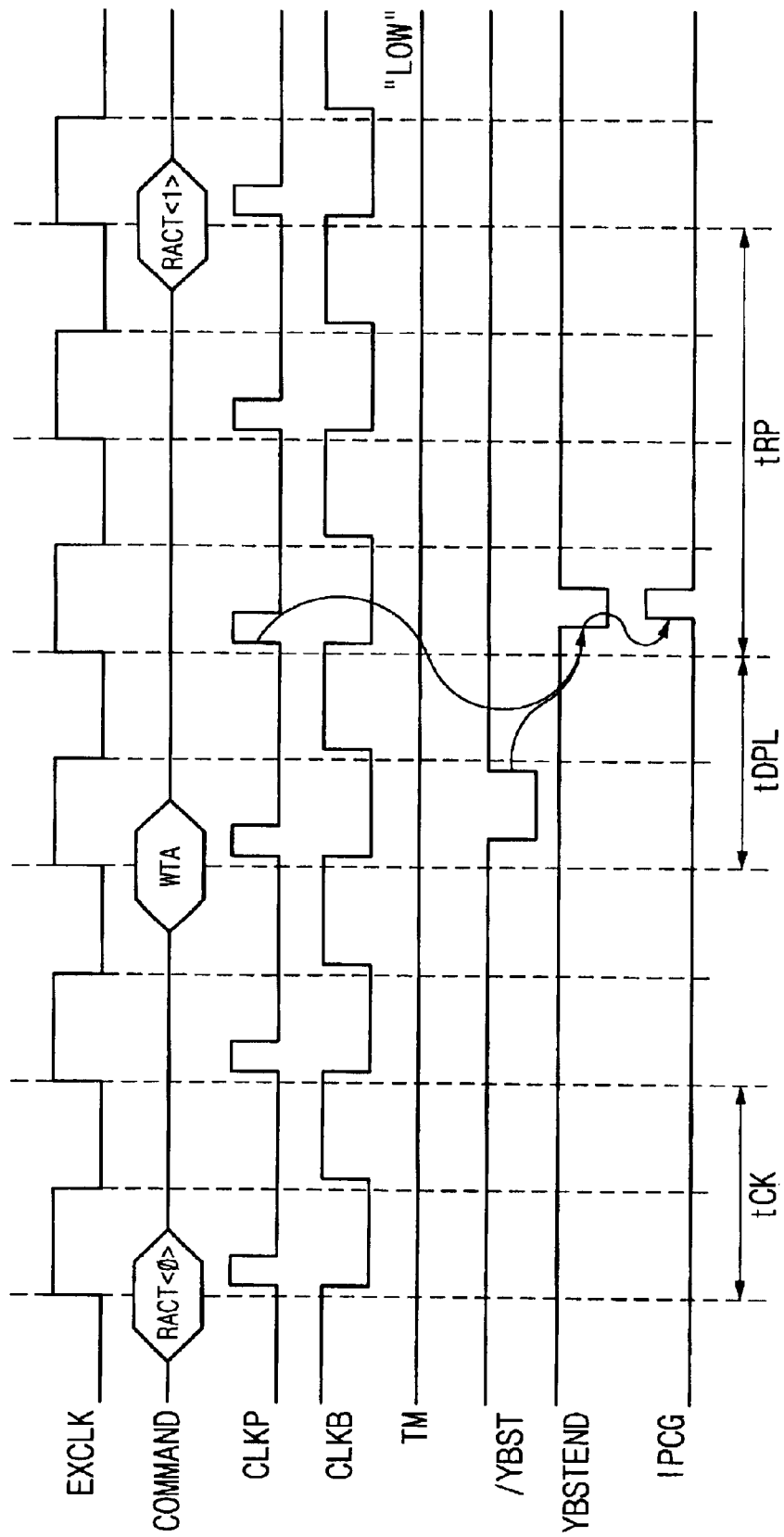
FIG. 3 is an operation timing diagram of a normal mode in FIG. 1.
Figure 4:
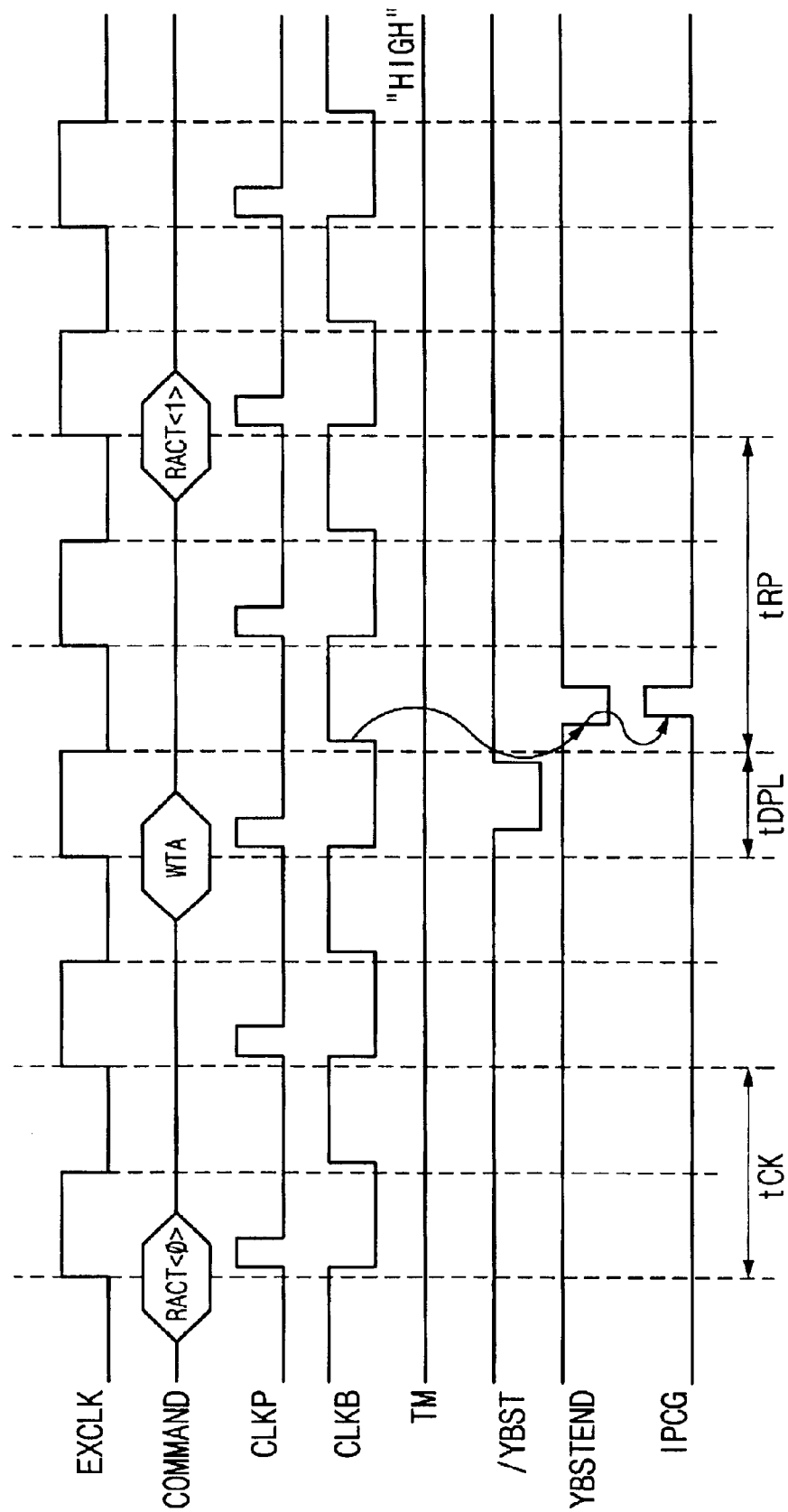
FIG. 4 is an operation timing diagram of a test mode in FIG. 1.
Figure 5:
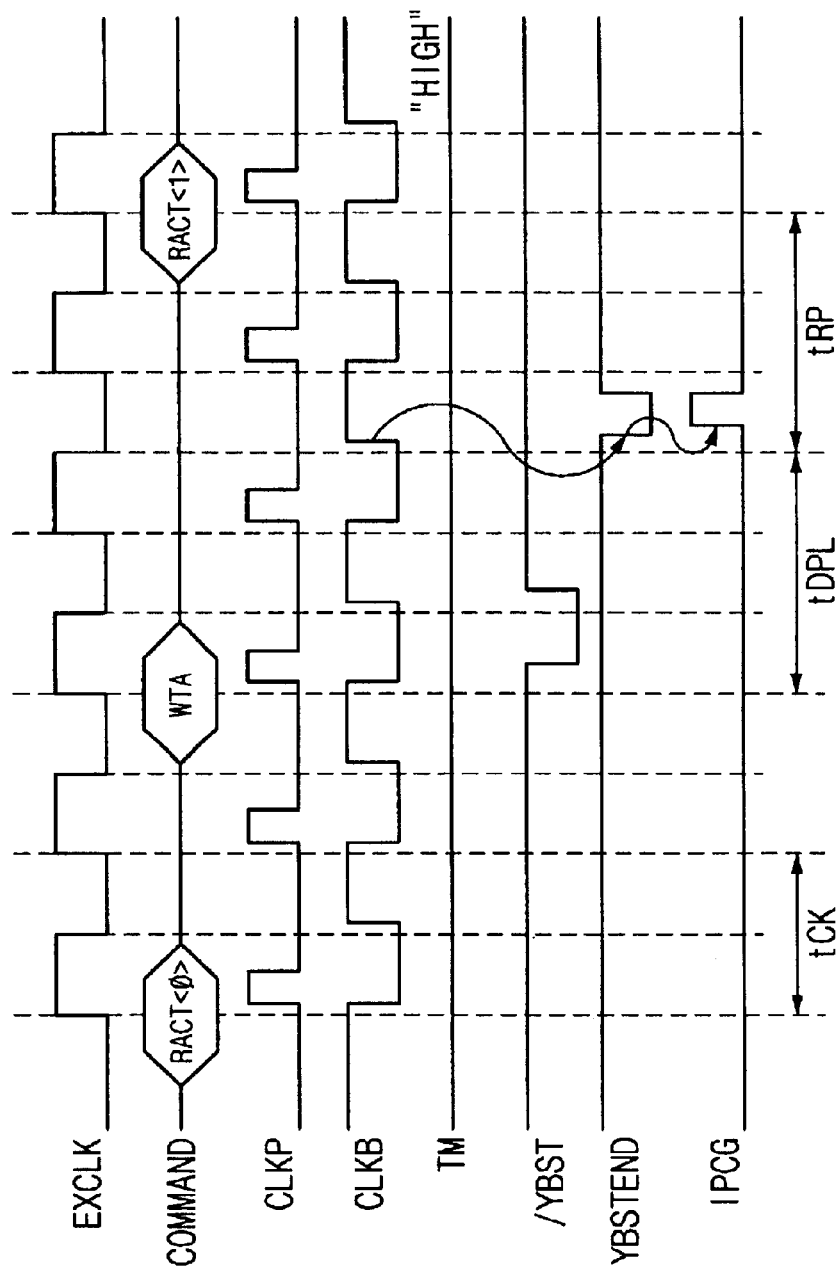
FIG. 5 is an operation timing diagram in a state where a burst end signal is delayed by one clock in the test mode of FIG. 1.
Figure 6:
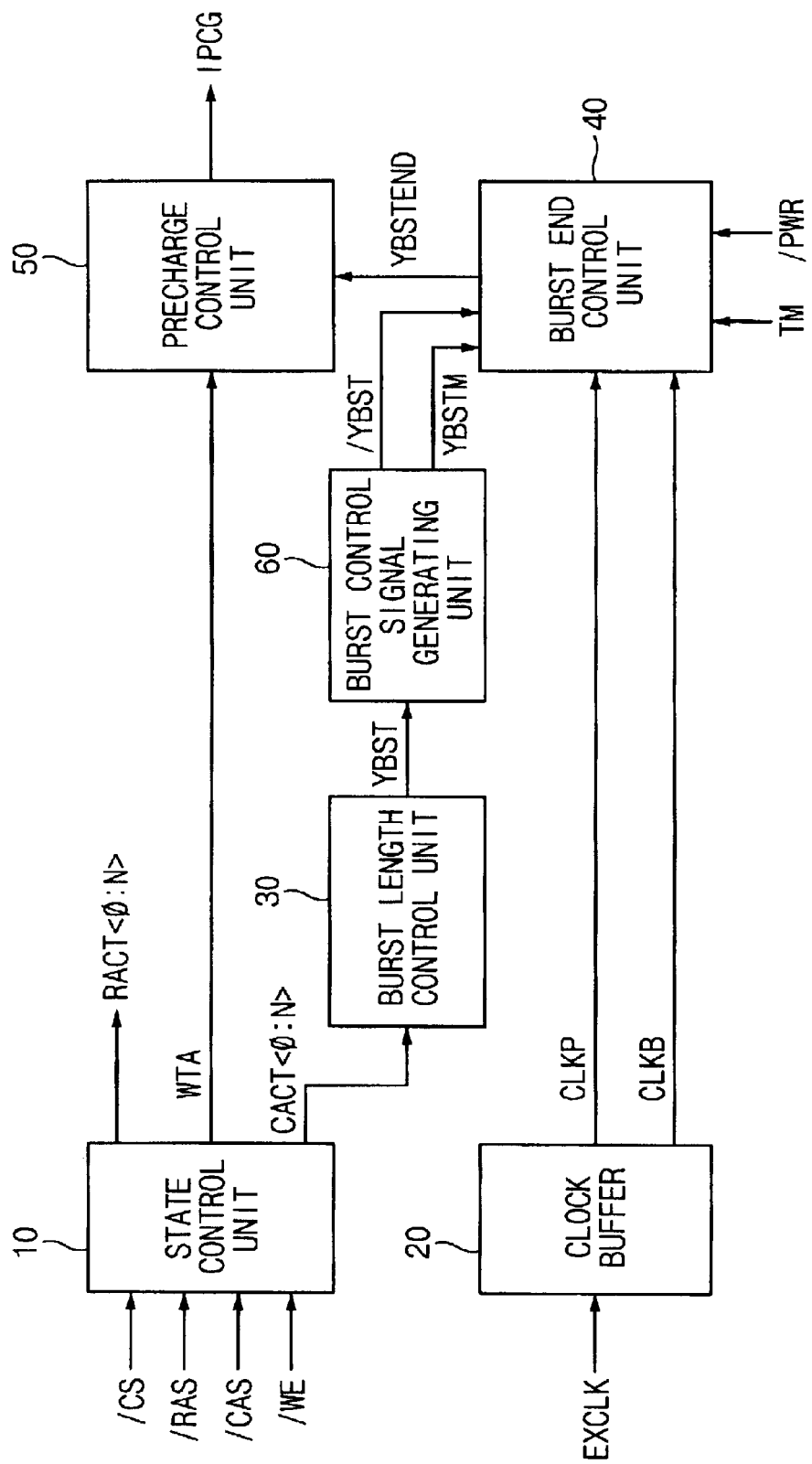
FIG. 6 is a block diagram illustrating a semiconductor memory device in accordance with the present disclosed apparatus.

As shown in FIG. 6, a semiconductor memory device includes a state control unit 10, a clock buffer 20, a burst length control unit 30, a burst end control unit 40, a precharge control unit 50, and a burst control signal generating unit 60. The state control unit 10 receives external control signals/CS, /RAS, /CAS and /WE and generates operation commands RACT, CACT and WTA. The clock buffer 20 receives an external clock signal EXCLK and generates a pulse clock signal CLKP having a short pulse in correspondence with a rising edge of the external clock signal EXCLK and an inverted clock signal CLKB having the opposite phase to the external clock signal EXCLK.

Burst length control unit 30 outputs a burst control signal YBST for maintaining an active state of a column operation as long as a burst length BL according to the column active command CACT. The burst control signal generating unit 60 receives the burst control signal YBST from the burst length control unit 30 and generates an inverted burst control signal/YBST having the opposite phase to the burst control signal YBST and a test mode burst control signal YBSTM having a short pulse in a rising edge of the burst control signal YBST.

The burst end control unit 40 detects an end point of the burst length BL and outputs a burst end signal YBSTEND notifying burst end, by using the inverted burst control signal/YBST in a normal mode and the test mode burst control signal YBSTM in a test mode. Finally, precharge control unit 50 generates a precharge signal IPCG for performing a precharge operation of the semiconductor memory device according to the burst end signal YBSTEND.

Figure 7:
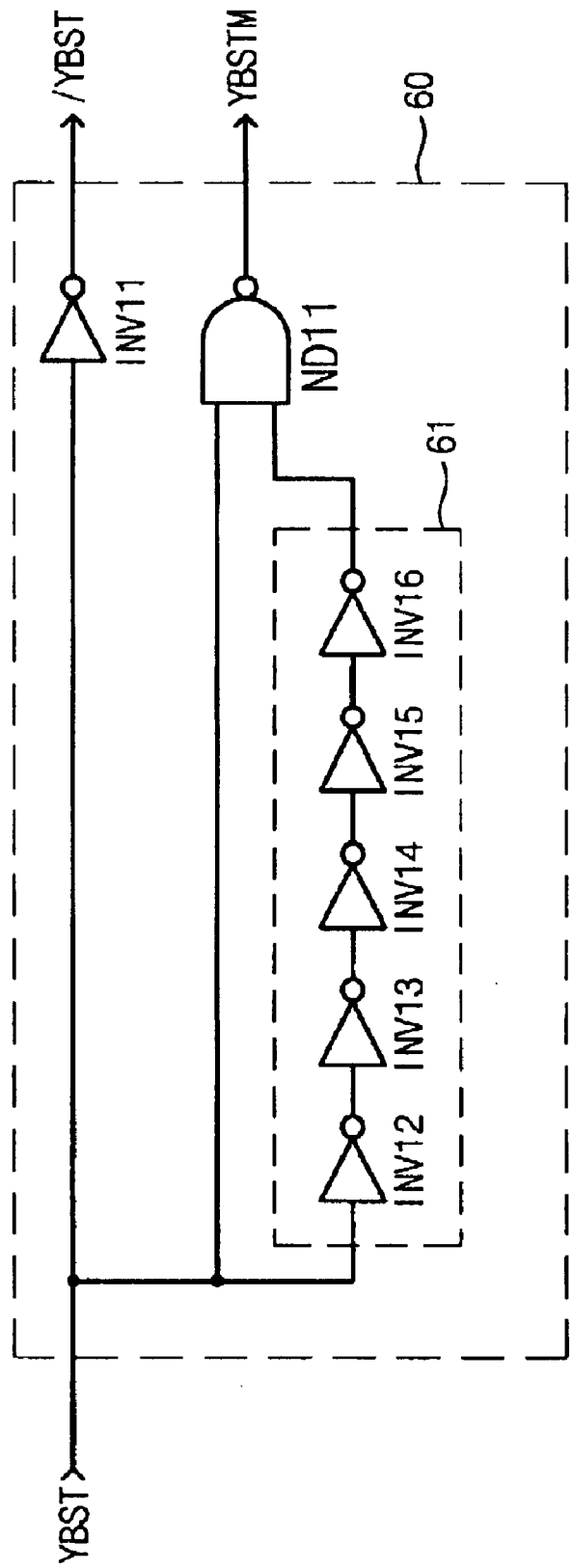
FIG. 7 is a detailed circuit diagram illustrating a burst control signal generating unit in FIG. 6.

FIG. 7 is a detailed circuit diagram illustrating the burst control signal generating unit 60 of the semiconductor memory device illustrated in FIG. 6. As shown, the burst control signal generating unit 60 includes an inverter INV11 for inverting the burst control signal YBST and outputting the inverted burst control signal/YBST, a delay unit 61 having an odd number of inverters INV12–INV16 for delaying the burst control signal YBST for a predetermined time and a NAND gate ND11 for NANDing the burst control signal YBST and the output signal from the delay unit 61 and outputting the test mode burst control signal YBSTM.

Figure 8:
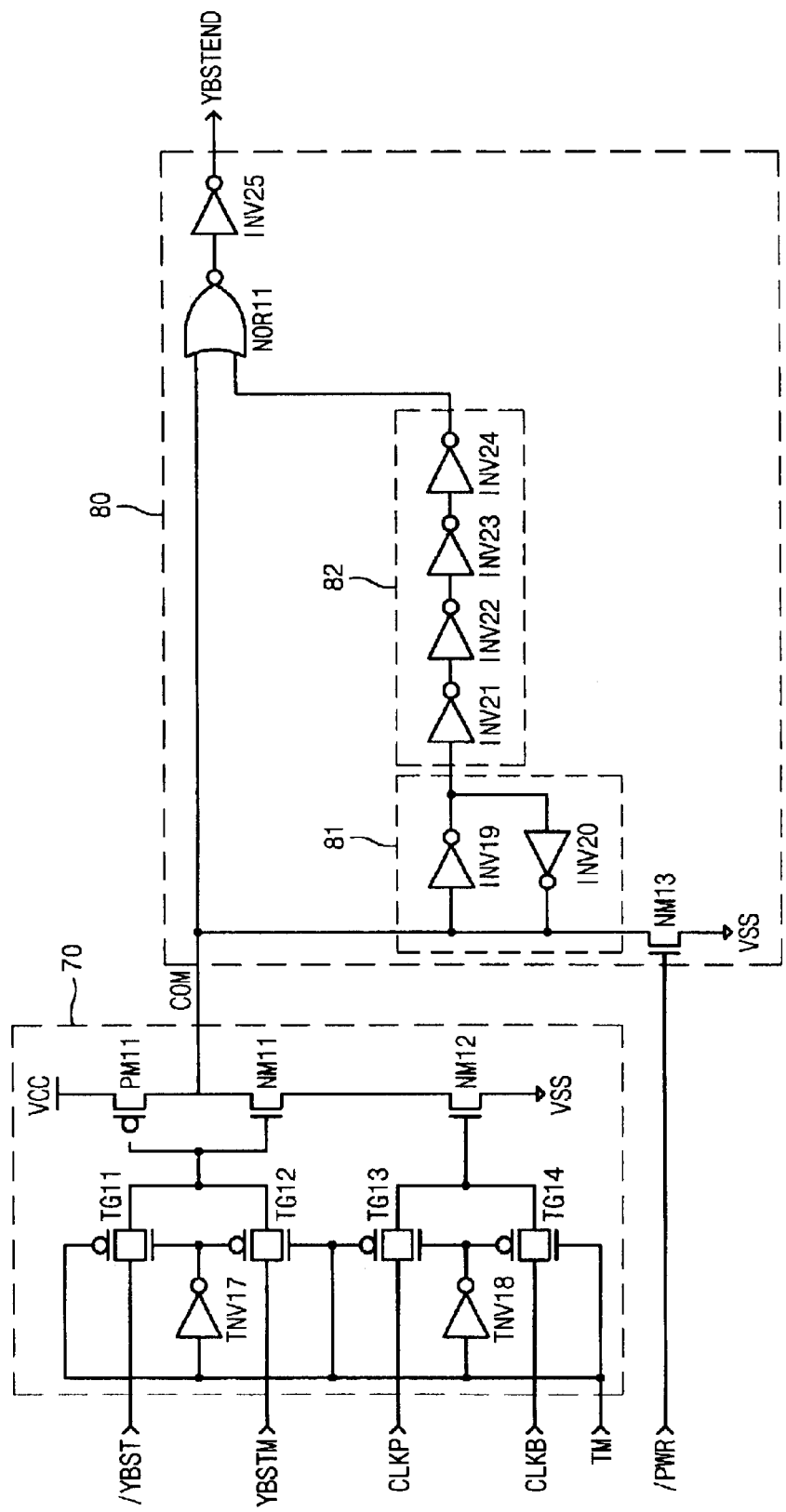
FIG. 8 is a detailed circuit diagram illustrating a burst end control unit in FIG. 6.

FIG. 8 is a detailed circuit diagram illustrating the burst end control unit 40 of the semiconductor memory device illustrated in FIG. 6. The burst end control unit 40 includes a comparing unit 70 enabled by test mode signal TM for driving the burst control signal/YBST according to the pulse clock signal CLKP in the normal mode, and driving the test mode burst control signal YBSTM according to the inverted clock signal CLKB in the test mode. The burst end control unit 40 also includes a burst end signal generating unit 80 for outputting the burst end signal YBSTEND according to an output signal COM from the comparing unit 70.

The comparing unit 70, in particular, includes transmission gates TG11 and TG12 for selectively transmitting the burst control signal/YBST and the test mode burst control signal YBSTM according to the test mode signal TM and an inverted signal/TM of the test mode signal TM by an inverter INV17. Transmission gates TG13 and TG14 are provided for selectively transmitting the pulse clock signal CLKP and the inverted clock signal CLKB according to the test mode signal TM and an inverted signal/TM of the test mode signal TM by an inverter INV18. A PMOS transistor PM11 and an NMOS transistor NM11 are included having their gates commonly connected to receive the signal selectively transmitted by the transmission gates TG11 and TG12 and their drains commonly connected. A source of the PMOS transistor PM11 is connected to receive a power voltage VCC. An NMOS transistor NM12 is included having its gate connected to receive the signal selectively transmitted by the transmission gates TG13 and TG14, its drain connected to the source of the NMOS transistor NM11 and its source connected to a ground voltage VSS.

The burst end signal generating unit 80 includes a latch unit 81 having two inverters INV19 and INV20 for latching the output signal COM from the comparing unit 70. A delay unit 82 is also included and comprises an even number of inverters INV21–INV24 for delaying the output signal from the latch unit 81 for a predetermined time. A NOR gate NOR11 is provided for NORing the output signal COM from the comparing unit 70 and the output signal from the delay unit 82. An inverter INV25 inverts the output signal from the NOR gate NOR11 and outputs the burst end signal YBSTEND. Finally, an NMOS transistor NM13 is included having its gate connected to receive a power up signal/PWR and resetting the output signal COM from the comparing unit 70 to the ground voltage VSS.

The operation of the semiconductor memory device illustrated in FIGS. 6–8 will now be explained.

In a normal mode when the test mode signal TM has a low level and a write command WTA with an autoprecharge command is inputted, a write operation is performed and the inverted burst control signal/YBST is disabled to a high level after the burst length BL. Since the test mode signal TM has a low level, a pulse of the burst end signal YBSTEND is generated in correspondence with a rising edge of the pulse clock signal CLKP after the inverted burst control signal/YBST is disabled. Finally, the precharge control unit 50 generates the precharge signal IPCG by using the burst end signal YBSTEND, thereby performing a precharge operation.

Figure 9:
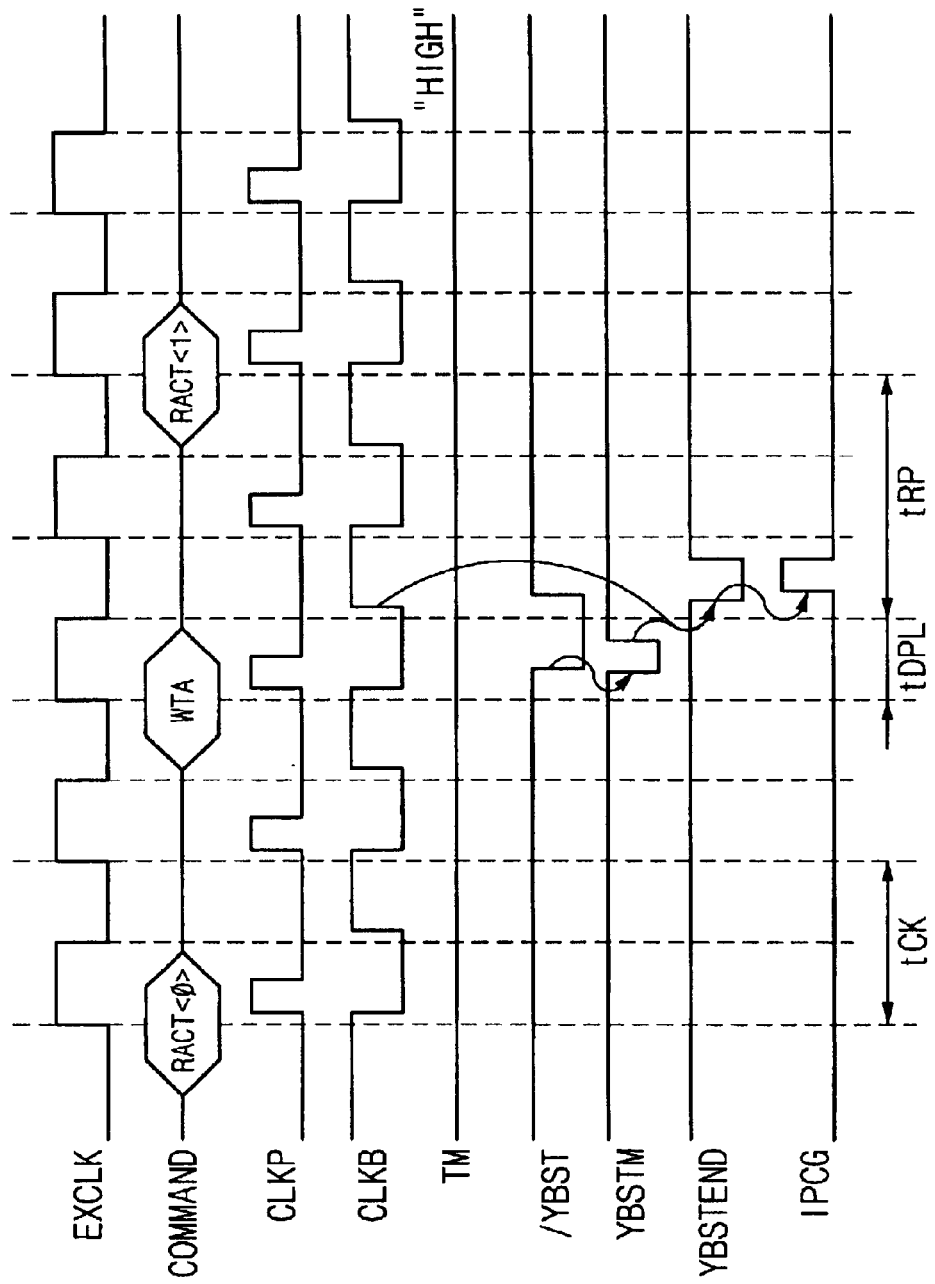
FIG. 9 is an operation timing diagram of a test mode in FIG. 6.

As depicted in FIG. 9, in the test mode, when the test mode signal TM has a high level and the write command WTA with the autoprecharge command is inputted, the write operation is performed and the burst control signal generating unit 60 generates the test mode burst control signal YBSTM by using the burst control signal YBST. The burst control signal generating unit 60 generates the test mode burst control signal YBSTM such that it is a short pulse having a pulse width as long as a delay time of the delay unit 61 in the rising edge of the burst control signal YBST. After the pulse of the test mode burst control signal YBSTM is generated, the burst end signal YBSTEND is generated in correspondence with the rising edge of the inverted clock signal CLKB. Accordingly, the precharge control unit 50 generates the precharge signal IPCG to perform the precharge operation.

Although the semiconductor memory device has a high operation frequency, the test mode burst control signal YBSTM is generated having the short pulse in correspondence with the rising edge of the burst control signal YBST and a precharge timing is controlled in the test mode, not by the burst control signal YBST, but by the test mode burst control signal YBSTM. Thus, it is possible to prevent delay of the test time due to delay of the precharge operation and to precisely screen a parameter tDPL.

As discussed earlier, although the semiconductor memory device to be tested is operated according to a high frequency clock signal, the parameter can be precisely screened by using the test circuit operated according to a low frequency clock signal. Moreover, the burst end signal for controlling the precharge operation in the test mode is generated according to the control signal having the short pulse in correspondence with the rising edge of the burst control signal to prevent delay of the test time due to a large pulse width of the burst control signal.

While the teachings of the invention have been explained with respect to a particular example, it will be apparent to those of ordinary skill in the art that the scope of this patent is not limited to this example. On the contrary, this patent covers all apparatuses falling within the spirit and scope of the appended claims, either literally or under the doctrine of equivalents.

What is claimed is:

1. A semiconductor memory device, comprising:
    a state control unit configured to receive external control signals and output internal commands;
    a burst length control unit configured to receive the internal commands from the state control unit and output a burst control signal for maintaining an active state of a column operation for as long as a burst length;
    a clock buffer configured to receive an external clock signal and generate a pulse clock signal for generating a pulse in accordance with a rising edge of the external clock signal and an inverted clock signal having a phase opposite to a phase of the external clock signal;
    a burst control signal generating unit configured to receive the burst control signal from the burst length control unit and generate an inverted burst control signal having a phase opposite to a phase of the burst control signal and a test mode burst control signal having a short pulse occurring within a disable time of the burst control signal;
    a burst end control unit that is controlled according to a test mode signal indicating a test mode, the burst end control unit configured to generate a burst end signal indicating a burst end time, by being synchronized with the inverted clock signal and using the inverted burst control signal during a normal operation, and by being synchronized with the pulse clock signal and using the test mode burst control signal during a test operation; and a precharge control unit configured to perform a precharge operation according to the burst end signal.

2. The device according to claim 1, wherein the burst end control unit further comprises:
   a comparing unit synchronized with the pulse clock signal and configured to drive the inverted burst control signal in a normal mode and synchronized with the inverted clock signal for driving the test mode burst control signal in a test mode according to the test mode signal; and
   a burst end signal generating unit configured to output the burst end signal according to the output signal from the comparing unit.

3. The device according to claim 2, wherein the comparing unit further comprises:
   a first transmission gate for selectively transmitting the inverted burst control signal according to the test mode signal;
   a second transmission gate for selectively transmitting the test mode burst control signal according to the test mode signal;
   a third transmission gate for selectively transmitting the pulse clock signal according to the test mode signal;
   a fourth transmission gate for selectively transmitting the inverted clock signal according to the test mode signal;
   a PMOS transistor and a first NMOS transistor having respective gates that are commonly connected together to receive the signals selectively transmitted by the first and second transmission gates, and having their drains commonly connected, a source of the PMOS transistor being connected to receive a power voltage; and
   a second NMOS transistor having a gate connected to receive the signal selectively transmitted by the third and fourth transmission gates, its drain connected to the source of the first NMOS transistor, and its source connected to a ground voltage.

4. The device according to claim 2, wherein the burst end signal generating unit further comprises:
   a latch configured to latch the output signal from the comparing means;
   a delay unit for delaying the output signal from the latch means for a predetermined time; and
   a logic device for logically combining the output signal from the comparing unit and the output signal from the delay unit and outputting the burst end signal.

5. The device according to claim 4, wherein the burst end signal generating unit further comprises a switching means for resetting the output signal from the comparing units to ground voltage.

6. The device according to claim 1, wherein the burst control signal generating means comprises:
   an inverter configured to invert the burst control signal and output the inverted burst control signal;
   a delay unit for delaying the burst control signal for a predetermined time; and
   a logic unit configured to logically combine the burst control signal and the output signal from the delay unit and output the test mode burst control signal.

7. A semiconductor memory device comprising:
   a state control unit configured to receive external control signals and output internal commands;
   a burst length control unit configured to receive the internal commands from the state control unit;
   a clock buffer configured to receive an external clock signal and generate a pulse clock signal for generating a pulse in accordance with a rising edge of the external clock signal and an inverted clock signal having a phase opposite to a phase of the external clock signal;
   a burst control signal generating unit configured to receive the burst control signal from the burst length control unit and generate an inverted burst control signal having a phase opposite to a phase of the burst control signal;
   a burst end control unit that is controlled according to a test mode signal indicating a test mode, the burst end control unit configured to generate a burst end signal indicating a burst end time; and
   a precharge control unit configured to perform a precharge operation according to the burst end signal.

8. The device according to claim 7, wherein the burst control signal generating unit is also configured to receive a test mode burst control signal having a short pulse occurring within a disable time of the burst control signal.

9. The device according to claim 7, wherein the burst length control unit maintains an active state of a column operation for as long as a burst length.

10. The device according to claim 7, wherein the burst end control unit is also synchronized with the inverted clock signal and using the inverted burst control signal during a normal operation 11. The device according to claim 7, wherein the burst end control unit is also synchronized with the pulse clock signal and using the test mode burst control signal during a test operation.

12. The device according to claim 10, wherein the burst end control unit is also synchronized with the pulse clock signal and using the test mode burst control signal during a test operation.

13. The device according to claim 7, wherein the burst end control unit further comprises:
   a comparing unit synchronized with the pulse clock signal and configured to drive the inverted burst control signal in a normal mode and synchronized with the inverted clock signal driving the test mode burst control signal in a test mode according to the test mode signal; and
   a burst end signal generating unit configured to output the burst end signal according to the output signal from the comparing unit.

14. The device according to claim 12, wherein the burst end control unit further comprises:
   a comparing unit synchronized with the pulse clock signal and configured to drive the inverted burst control signal in a normal mode and synchronized with the inverted clock signal for driving the test mode burst control signal in a test mode according to the test mode signal; and
   a burst end signal generating unit configured to output the burst end signal according to the output signal from the comparing unit.

15. The device according to claim 13, wherein the comparing unit further comprises:
   a first transmission gate for selectively transmitting the inverted burst control signal according to the test mode signal;
   a second transmission gate for selectively transmitting the test mode burst control signal according to the test mode signal;
   a third transmission gate for selectively transmitting the pulse clock signal according to the test mode signal;
   a fourth transmission gate for selectively transmitting the inverted clock signal according to the test mode signal;

a PMOS transistor and a first NMOS transistor having respective gates that are commonly connected together to receive the signals selectively transmitted by the first and second transmission gates, and having their drains commonly connected, a source of the PMOS transistor being connected to receive a power voltage; and a second NMOS transistor having a gate connected to receive the signal selectively transmitted by the third and fourth transmission gates, its drain connected to the source of the first NMOS transistor, and its source connected to a ground voltage.

16. The device according to claim 14, wherein the comparing unit further comprises:

a first transmission gate for selectively transmitting the inverted burst control signal according to the test mode signal;

a second transmission gate for selectively transmitting the test mode burst control signal according to the test mode signal;

a third transmission gate for selectively transmitting the pulse clock signal according to the test mode signal;

a fourth transmission gate for selectively transmitting the inverted clock signal according to the test mode signal;

a PMOS transistor and a first NMOS transistor having respective gates that are commonly connected together to receive the signals selectively transmitted by the first and second transmission gates, and having their drains commonly connected, a source of the PMOS transistor being connected to receive a power voltage; and a second NMOS transistor having a gate connected to receive the signal selectively transmitted by the third and fourth transmission gates, its drain connected to the source of the first NMOS transistor, and its source connected to a ground voltage.

17. The device according to claim 13, wherein the burst end signal generating unit further comprises:

a latch configured to latch the output signal from the comparing means;

a delay unit for delaying the output signal from the latch means for a predetermined time; and a logic device for logically combining the output signal from the comparing unit and the output signal from the delay unit and outputting the burst end signal.

18. The device according to claim 14, wherein the burst end signal generating unit further comprises:

a latch configured to latch the output signal from the comparing means;

a delay unit for delaying the output signal from the latch means for a predetermined time; and a logic device for logically combining the output signal from the comparing unit and the output signal from the delay unit and outputting the burst end signal.

19. The device according to claim 17, wherein the burst end signal generating unit further comprises a switching means for resetting the output signal from the comparing units to ground voltage.

20. The device according to claim 18 wherein the burst end signal generating unit further comprises a switching means for resetting the output signal from the comparing units to ground voltage.

21. The device according to claim 7, wherein the burst control signal generating means comprises:

an inverter configured to invert the burst control signal and output the inverted burst control signal;

a delay unit for delaying the burst control signal for a predetermined time; and a logic unit configured to logically combine the burst control signal and the output signal from the delay unit and output the test mode burst control signal.

* * * * *